United States Patent
Giles et al.

(10) Patent No.: US 9,046,574 B2
(45) Date of Patent: Jun. 2, 2015

(54) TEST CIRCUIT HAVING SCAN WARM-UP

(71) Applicant: Advanced Micro Devices, Inc., Sunnyvale, CA (US)

(72) Inventors: Grady L. Giles, Dripping Springs, TX (US); James A. Wingfield, Austin, TX (US); Atchyuth K. Gorti, Austin, TX (US)

(73) Assignee: ADVANCED MICRO DEVICES, INC, Sunnyvale, CA (US)

( * ) Notice: Subject to any disclaimer, the term of this patent is extended or adjusted under 35 U.S.C. 154(b) by 0 days.

(21) Appl. No.: 13/687,837

(22) Filed: Nov. 28, 2012

(65) Prior Publication Data
US 2014/0149813 A1    May 29, 2014

(51) Int. Cl.
*G01R 31/28* (2006.01)
*G01R 31/3185* (2006.01)

(52) U.S. Cl.
CPC *G01R 31/318544* (2013.01); *G01R 31/318555* (2013.01)

(58) Field of Classification Search
CPC .. G01R 29/26; G06F 17/5036; G06F 2217/82
USPC ......... 714/726, 731, 724, 727, 732, 733, 744; 716/136; 377/10; 703/14; 327/564; 702/69
See application file for complete search history.

(56) References Cited

U.S. PATENT DOCUMENTS

2012/0049947 A1*  3/2012  Arsovski et al. .............. 327/564

OTHER PUBLICATIONS

Jeff Rearick; "Too Much Delay Fault Coverage Is a Bad Thing"; Proceedings of the IEEE International Test Conference; 2001; pp. 624-633; ISBN: 0-7803-7169-0; IEEE Computer Society Washington, DC, USA.

* cited by examiner

*Primary Examiner* — Guy Lamarre
(74) *Attorney, Agent, or Firm* — Polansky & Associates, P.L.L.C.; Paul J. Polansky

(57) ABSTRACT

A test circuit for a functional circuit includes a scan chain coupled to the functional circuit, and a controller coupled to the scan chain, for controlling the scan chain to scan a test pattern into the scan chain, and subsequently and repetitively for a multiple number of times launch the test pattern to the functional circuit, capture test data into the scan chain, and restore the test pattern in the scan chain for subsequent launch.

23 Claims, 6 Drawing Sheets

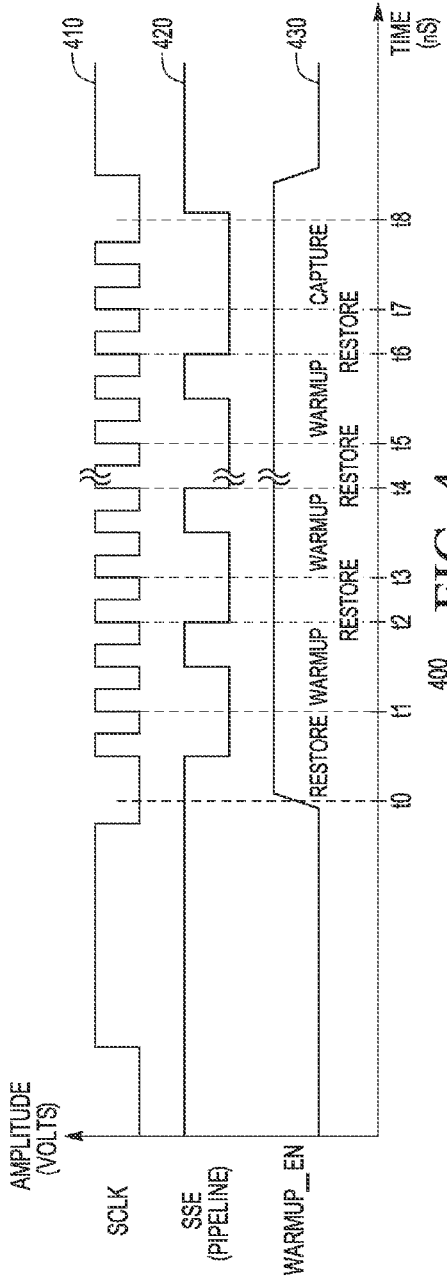

US 9,046,574 B2

TEST CIRCUIT HAVING SCAN WARM-UP

FIELD

This disclosure relates generally to test circuits, and more specifically to a test circuit having a scan chain.

BACKGROUND

Consumers continue to demand complex functional circuits, with higher performance and lower cost, such as data processors, very large scale integrated circuits (VLSI), systems on chips (SoCs), central processing units (CPUs), advanced processing units (APUs), graphics processing units (GPUs), memory sub-systems, system controllers, and peripheral functions. At the same time, testing the operation of the functional circuit and determining that the functional circuit is operating as desired is increasingly difficult. Robust testing technologies have been developed such as boundary scan, now defined as a standard by the Joint Test Action Group (JTAG). Also, Automatic Test Pattern Generation (ATPG), which is compatible with many automatic test equipment systems, is used to determine if a functional circuit is operating according to specification. More advanced "at speed" ATPG technologies launch test patterns and capture the resulting data in a manner that tests a functional circuit at substantially the same speed the functional circuit runs during normal operation.

However a problem arises when testing circuits at speed by using a test pattern received and launched from an internal scan chain. The scan operation involves shifting bits of data serially through the scan chain at a relatively low speed. Once the test is enabled, however, a relatively large number of logic gates switch at high speed and their outputs are captured in the scan chain. This scan-to-test transition can cause a significant disruption on the internal power supply voltage, and the disruption can distort the test and cause circuits that operate according to specifications to fail.

BRIEF DESCRIPTION OF THE DRAWINGS

FIG. 4 illustrates a timing diagram useful in understanding the operation of the test circuit of FIG. 2 when using a first test methodology.

FIG. 5 illustrates a timing diagram useful in understanding the operation of the scan cell of FIG. 3 when using a second test methodology.

Figure 1:
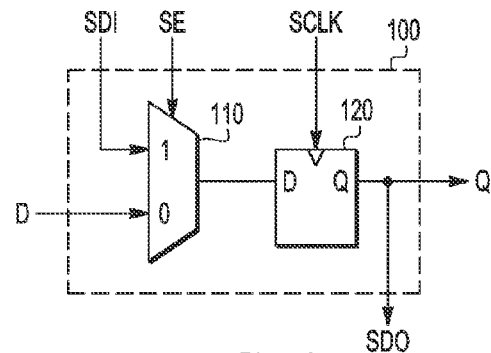
FIG. 1 illustrates in block diagram form a scan cell known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

FIG. 1 illustrates in block diagram form a scan cell 100 known in the prior art. Scan cell 100 generally includes a multiplexer 110 and a scan latch 120 which is an edge sensitive scan latch.

Multiplexer 110 has a select input to receive a scan enable signal labeled "SE", an input ("1") to receive a scan data input signal labeled "SDI", an input ("0") to receive a data signal labeled "D", and an output. Scan latch 120 has a clock input to receive a clock signal labeled "SCLK", a data input ("D") connected to the output of multiplexer 110, and an output ("Q") to provide a serial data output signal labeled "SDO" and which forms a signal input to a functional circuit also labeled "Q". The serial data output signal is used as a signal input to the "SDI" input of the next scan cell in a scan chain arrangement.

In operation, in a scan shift mode, multiplexer 110 provides SDI to the D input of scan latch 120 in response to a logic high on signal SE. Scan latch 120 latches SDI on a rising edge of SCLK to provide SDO. Other latches in the scan chain (not shown in FIG. 1) are used to shift a test pattern through the scan chain until it is properly aligned.

In a test mode, during a launch phase, scan cell 100 launches the Q output of scan latch 120 after the scan shift mode is finished. In a capture phase, multiplexer 110 provides captured data D to the D input of scan latch 120 in response to a logic low on signal SE. Scan latch 120 latches the capture data on a rising edge of SCLK.

Figure 2:
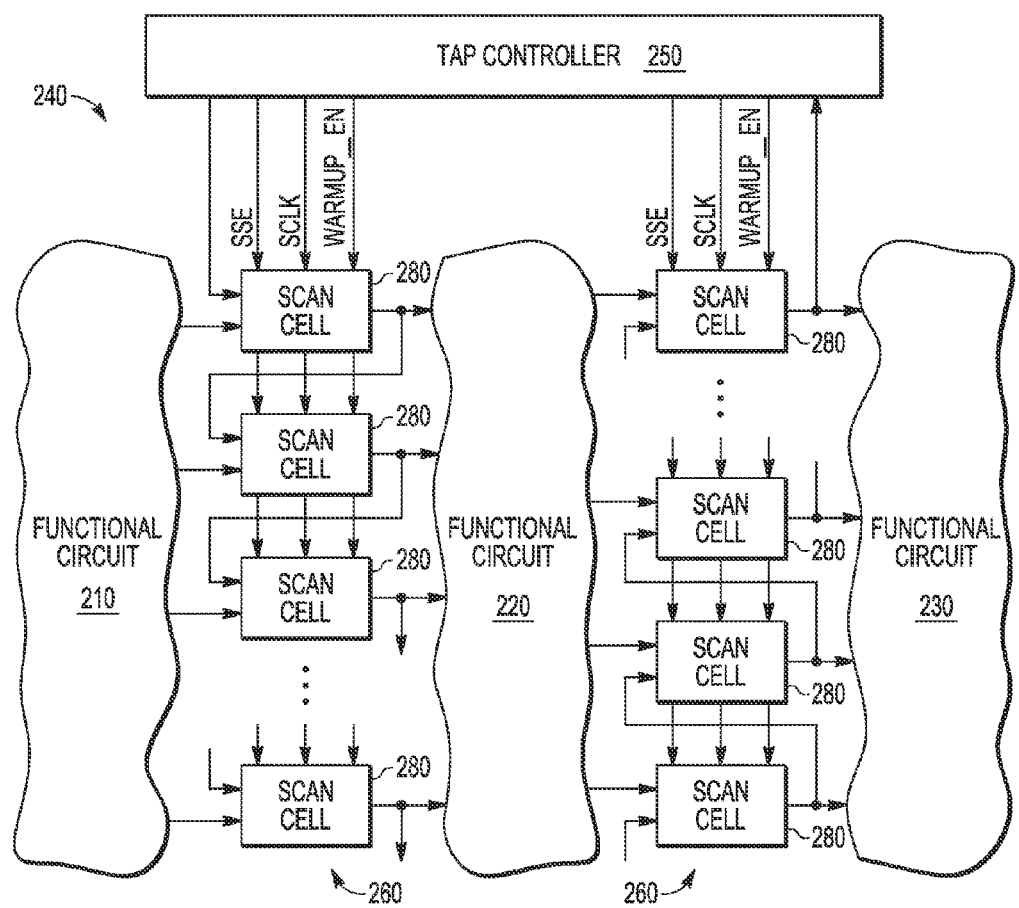
FIG. 2 illustrates in block diagram form an integrated circuit including a test circuit according to some embodiments.

FIG. 2 illustrates in block diagram form an integrated circuit 200 including a test circuit 240 according to some embodiments. Integrated circuit 200 includes three representative functional circuits 210, 220, and 230, and test circuit 240.

Functional circuits 210, 220, and 230 may have a multiple number of inputs (not shown for functional circuit 210) and a multiple number of outputs (not shown for functional circuit 230).

Test circuit 240 includes a controller 250 and a scan chain 260. Controller 250 has an output to provide a scan shift enable signal labeled "SSE", an output to provide a shift clock signal labeled "SCLK", and an output to provide a control signal labeled "WARMUP_EN" to scan cells in scan chain 260. Controller 250 also has a scan data output to provide scan data to the first scan cell in scan chain 260, and a scan data input to receive test data from the last scan cell in scan chain 260.

Scan chain 260 includes a multiple number of scan cells 280 forming a chain in which a scan data output of one scan cell is connected to a scan data input of the next scan cell in the chain. The first scan cell 280 of scan chain 260 has a scan data input connected to the scan data output of controller 250. Each subsequent scan cell 280 of scan chain 260 receives serial data input from the previous scan cell 280. The last scan cell 280 of scan chain 260 has a scan data output connected to the scan data input of controller 250.

In operation, controller 250 provides an interface for an external agent to load a scan pattern into integrated circuit 200, perform a test using the scan pattern, and determine the response of the various functional circuits to the test pattern. In this particular example, controller 250 defines a common boundary scan test interface and conforms to the Institute of Electrical and Electronic Engineers ("IEEE") standard 1149.1. Controller 250 first controls scan chain 260 to shift in the desired test pattern. During scan shifting, controller 250 provides the SCLK signal at a relatively low speed, such as 200 megahertz (MHz). When the test pattern has been shifted into the appropriate position in scan chain 260, controller 250 warms up the functional circuits by repetitively outputting the desired test pattern from scan cells 280 to the corresponding functional circuits and captures preliminary test data generated by the test pattern in scan cells 280. Controller 250 then restores the original test pattern to the output of scan latches within scan cells 280. Controller 250 provides SCLK as a relatively high-speed clock, such as 2 gigahertz (GHz), during test mode. The relatively high-speed clock allows the functional circuits to react in the same way they would react during normal operation, and to load the power supply in the same way. By repetitively performing warmup sequences and then restoring the desired test data to the scan latches, test circuit 240 causes the power supply voltage to settle so that the results of the at-speed test will eventually reflect the operation of the circuit under normal operating conditions. After a desired number of repetitions, corresponding to a power supply voltage settling time interval during which the power supply voltage initially deviates from its nominal value and subsequently returns to approximately the nominal value, test circuit 240 captures test response data generated by the functional circuits into scan chain 260 and shifts the test response data out.

Figure 3:
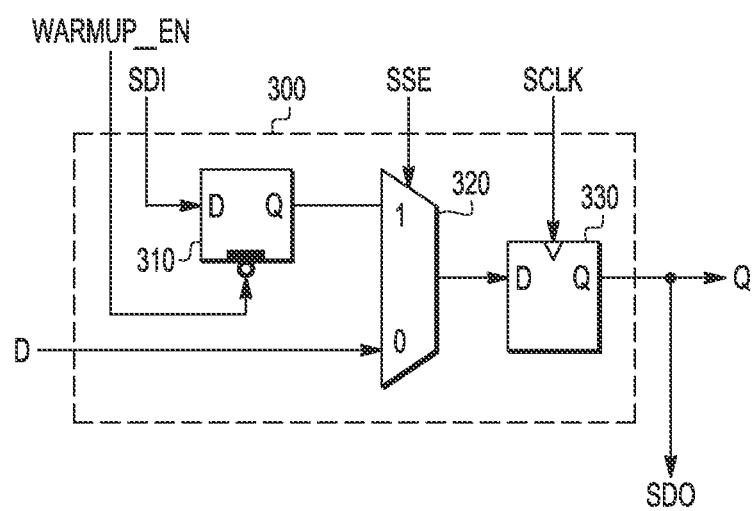
FIG. 3 illustrates in block diagram form a first scan cell that may be used to implement the scan cells of FIG. 2 according to some embodiments.

FIG. 3 illustrates in block diagram form a first scan cell 300 that may be used to implement scan cells 280 of FIG. 2 according to some embodiments. Scan cell 300 generally includes a restore latch 310 which is a level sensitive latch, a multiplexer 320, and a scan latch 330 which is an edge sensitive latch.

Restore latch 310 has an active low enable input to receive signal WARMUP_EN, a D input to receive signal SDI from a previous scan latch, and a Q output. Multiplexer 320 has an input to receive a scan shift enable input labeled "SSE", a 1 input connected to the Q output of restore latch 310, a 0 input to receive a data signal D, and an output. Scan latch 330 has a clock input to receive signal SCLK, a D input connected to the output of multiplexer 320, and a Q output to provide serial data output signal SDO to a subsequent latch and output signal Q to a functional circuit.

Considering both FIGS. 2 and 3, in a scan shift mode, controller 250 provides signal WARMUP_EN at a logic low and signal SSE at a logic high to scan cell 300. Restore latch 310 operates in a transparent mode during an inactive WARMUP_EN (WARMUP_EN at a logic low) in which the output changes in response to changes in the input. Multiplexer 320 provides SDI to the D input of scan latch 330 while signal SSE is at a logic high. Scan latch 330 latches the value of SDI on the next low-to-high transition of SCLK. Controller 250 provides additional transitions of SCLK to move data into successive positions until the desired test pattern has moved into the desired position in the scan chain.

When controller 250 has shifted the test pattern into the desired position in the scan chain, it provides signal WARMUP_EN at a logic high to latch SDI in restore latch 310 and enters the test mode. The test mode has three phases: restore, launch, and capture. In the restore phase, controller 250 provides SSE at a logic high at a time sufficient to provide adequate setup time at the input of scan latch 330. A low-to-high transition of SCLK captures the data in scan latch 330 and outputs the data to the corresponding functional circuit. In the capture phase, controller 250 provides signal SSE at a logic low to select the D input of multiplexer 320 at a time sufficient to provide adequate setup time at the input of scan latch 330, and this value is latched into scan latch 330 on the next rising edge of SCLK. The launch phase separates the restore and capture phases. Controller 250 repeats the restore, launch, and capture phases a multiple number of times to warm up the functional circuits. By changing the data at the output of scan latch 330 with data from the D input (via the multiplexor 320 selector SSE=0 path) during the launch phase, scan cell 300 ensures that the functional circuits under test are subjected to the same type of signal transitions at the same speed as they would encounter during normal operation.

After the end of the test mode, controller 250 enters a shift out mode by providing WARMUP_EN at a logic low and SSE at a logic high and providing a series of SCLK pulses at a relatively low speed to shift the captured test response data out of the scan chain for comparison with expected results.

Note that while scan cell 300 adds an additional level-sensitive restore latch 310 that requires a few extra transistors to implement, restore latch 310 eliminates the need for extra hold time buffers between scan cells as is typically needed in scan chain 260. Thus in actual embodiments the additional circuit area required to implement scan cell 300 will be smaller than the size of an extra latch per cell.

FIG. 4 illustrates a timing diagram 400 useful in understanding the operation of test circuit 240 of FIG. 2 used in a first test methodology. The horizontal axis represents time in nanoseconds (nS), and the vertical axis represents the amplitude of various signals in volts. Timing diagram 400 illustrates three waveforms of interest, an SCLK waveform 410, an SSE waveform 420, and a WARMUP_EN waveform 430. The horizontal axis illustrates several particular time points of interest labeled "t0" through "t8", themselves defining various time periods of interest, including the time period preceding t0, the time periods labeled "RESTORE" from t0 to t1, t2 to t3, t4 to t5, and t6 to t7, the time periods labeled "WARMUP" from t1 to t2, t3 to t4, and t5 to t6, the time period labeled "CAPTURE" from t7 to t8, and the time period following t8.

In operation, controller 250 performs a launch on capture (LOC) test methodology. For the LOC test methodology, test circuit 240 launches a test pattern, the functional circuits under test provide data to the (D) input signal of multiplexer 320, and scan latch 330 captures the data on a rising edge of CLK (waveform 410) when signal SSE is at a logic low (SSE waveform 420).

Before time t0, controller 250 provides SCLK at a relatively low speed, such as 200 MHz, and test circuit 240 operates in the scan-in mode to shift a test pattern through scan chain 260. When controller 250 has shifted the test pattern into scan chain 260, it provides signal WARMUP_EN at a logic high. Between time t0 and t1, controller 250 performs an initial RESTORE cycle and restore latch 310 latches the test data. The initial RESTORE cycle is needed for ATPG to shift the test pattern into the desired position in the scan chain. Controller 250 subsequently provides signal SSE at a logic low and after a launch period starting at t1, the scan chain captures the test data on the next rising edge of SCLK.

Time t1 to time t2 defines a WARMUP period covering the launch and capture phases, during which controller 250 provides SSE at a logic high with sufficient setup time before the next rising edge of SCLK to set the test data in restore latch 310 to the D input of scan latch 330. At the next rising edge of SCLK at time t2, scan latch 330 restores the test data before another WARMUP period.

The RESTORE and WARMUP periods described from time t0 to time t2 repeat at times t2 to t4, t4 to t6, and t6 to t7.

From times t7 to t8, controller 250 performs final LAUNCH and CAPTURE phases, which includes a launch period starting at t7 before capturing the output data at the next rising edge of SCLK. To scan the test data out, controller 250 deactivates WARMUP_EN after t8, and scan chain 260 shifts the test data to controller 250 again using a relatively low-frequency clock.

Signal SSE is a pipelined signal that is at a logic high a setup time before a rising edge of SCLK to implement the restore phase, and is at a logic low a setup time before subsequent rising edges of SCLK to implement the launch and capture phases. Test circuit 240 uses a tree circuit to generate SSE with appropriate timing, that has a trunk and branches to account for propagation delays throughout the scan chain.

FIG. 5 illustrates a timing diagram 500 useful in understanding the operation of scan cell 300 of FIG. 3 when using a second test methodology. The horizontal axis represents time in nanoseconds (nS), and the vertical axis represents amplitude of various signals in volts. Timing diagram 500 illustrates three waveforms of interest, including an SCLK waveform 510, an SSE waveform 520, and a WARMUP_EN waveform 530. The horizontal axis illustrates several particular time points of interest t0 through t3, themselves defining various time periods of interest, including the time period preceding t0, a time period from t1 to t2 labeled "LOS", and a RESTORE time period from t2 to t3.

In operation, controller 250 implements the timing diagram of FIG. 5 to perform a launch on shift (LOS) test methodology. For the LOS test methodology, test circuit 240 launches a test pattern on the last shift cycle of the scan shift mode, when signal SSE is active before a low-to-high transition of SCLK (SSE waveform 520).

Before time t0, controller 250 provides SCLK at a relatively low clock speed, such as 200 MHz, and integrated circuit 200 operates in the scan shift test mode to shift a test pattern through scan chain 260. At time t0, controller 250 has previously asserted an active SSE and further asserts an active WARMUP_EN (waveform 530). In response, restore latch 310 latches the test pattern. Scan latch 330 latches the test pattern on the next rising edge of SCLK (waveform 510).

From time t1 to time t2, during the LOS phase, controller 250 de-asserts SSE and provides a launch pulse on SCLK to launch the test pattern into functional circuitry such as functional circuit 220. From time t2 to time t3, during a CAPTURE phase, controller 250 provides a capture pulse on SCLK and scan latch 330 latches the captured data, while restore latch 310 continues to store the test pattern. After the CAPTURE phase is performed, controller 250 asserts an active SSE and an inactive WARMUP_EN, and scan chain 260 shifts the test result to controller 250.

While scan cell 300 can be used to implement the LOS test methodology without warmup, it cannot realize the warmup capability at the same time as a LOS methodology. This incompatibility is due to the inability to restore the starting state from a LOS test pattern.

Figure 6:
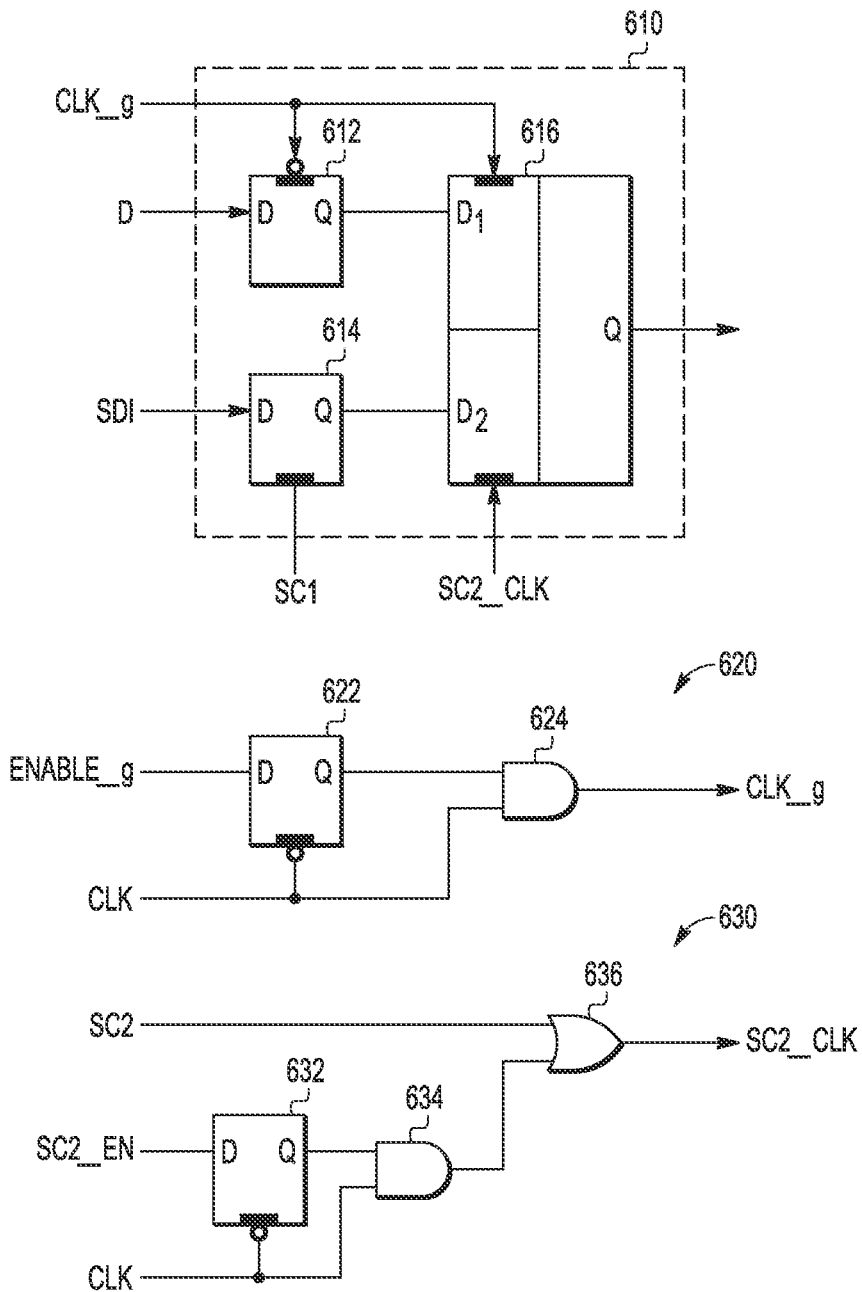
FIG. 6 illustrates in block diagram form a second scan cell that may be used to implement the scan cells of FIG. 2 and associated clock generation circuits according to some embodiments.

FIG. 6 illustrates in block diagram form a second scan cell 610 that may be used to implement scan cells 280 of FIG. 2 and associated gated clock signal generators 620 and 630 according to some embodiments. Scan cell 610 is a level sensitive scan design (LSSD) cell, and includes a data latch 612 which is a level sensitive latch, a scan latch 614 which is a level sensitive latch, and an output latch 616 which includes two level sensitive input stages that share an output stage. Data latch 612 has an active low enable input to receive a signal labeled "CLK_g", a D input to receive data signal D, and a Q output. Data latch 614 has an enable input to receive a scan clock signal labeled "SC1", a D input to receive signal SDI, and a Q output. Stage 1 of output latch 616 has an enable input to receive CLK_g, and a D1 input connected to the output of data latch 612. Stage 2 of output latch 616 has an enable input to receive a scan clock labeled "SC2_CLK", and a D2 input connected to the output of scan latch 614. Output latch 616 also has a Q output to provide a serial data output signal SDO and which forms a Q signal input to a functional circuit.

Gated clock signal generator 620 includes a latch 622 which is a level sensitive latch, and an AND gate 624. Latch 622 has an active low enable input to receive a high-speed clock signal labeled "CLK", a D input to receive a control signal labeled "ENABLE_g", and a Q output. AND gate 624 has an input connected to the Q output of latch 622, an input to receive signal CLK, and an output to provide signal CLK_g.

Gated clock signal generator 630 includes a latch 632, an AND gate 634, and an OR gate 636. Latch 632 has an active low enable input to receive signal CLK, a D input to receive a scan enable signal labeled "RESTORE_EN", and a Q output. AND gate 634 has an input connected to the Q output of latch 632, an input to receive signal CLK, and an output. OR gate 636 has an input to receive a scan clock signal labeled "SC2", an input connected to the output of AND gate 634, and an output to provide signal SC2_CLK.

In operation, for an LSSD test methodology, data latch 612 operates with output latch 616 in a normal mode and a capture mode, based on logic high and logic low states of signal CLK_g. Scan latch 614 operates with output latch 616 in an LSSD scan shift mode based on asserted non-overlapping SC1 and SC2_CLK edges.

Controller 250 provides signal CLK at a second clock rate, faster than the shift clock rate, and gated clock signal generator 620 provides a CLK_g launch pulse followed by a CLK_g capture pulse, when enabled by ENABLE_g, as a function of CLK. While controller 250 provides RESTORE_EN at a logic low, gated clock signal generator 630 provides SC2_CLK edges to scan cell 610 as a function of the lower-speed SC2 scan clock signal. While controller 250 provides RESTORE_EN at a logic high, gated clock signal generator 630 provides SC2_CLK edges to scan cell 610 as a function of the higher speed CLK. Scan latch 614 restores test patterns to output latch 616 using the faster CLK.

As for scan cell 280 of FIG. 3, controller 250 controls scan cell 610 to perform a desired number of warm-up and restore cycles to mitigate the power supply droop that would otherwise occur during a rapid transition between scan and test modes. At the end of the desired number of cycles, controller 250 controls scan cell 610 to capture reliable test response data and scan the test response data out of the scan chain.

Figure 7:
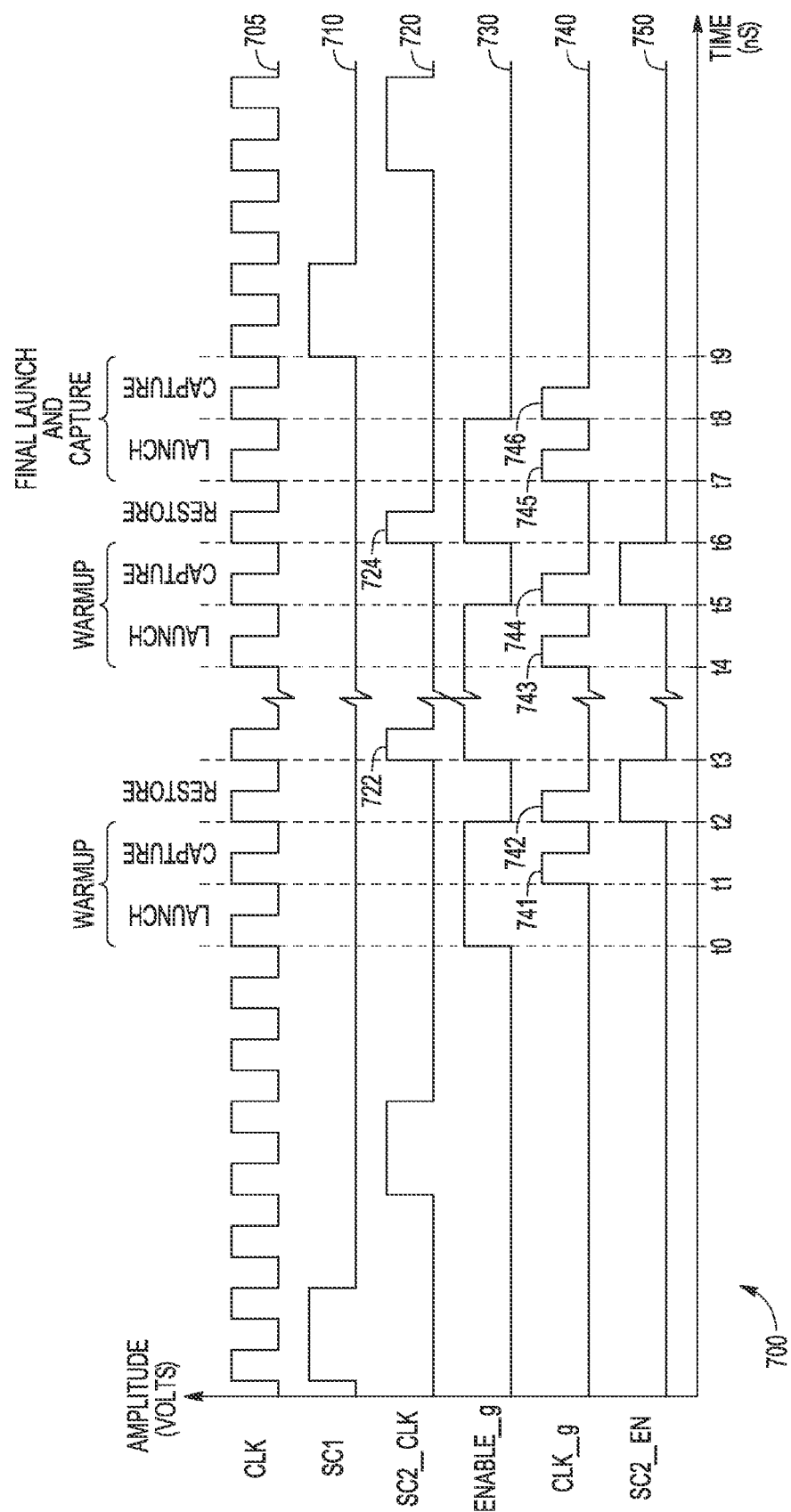
FIG. 7 illustrates a timing diagram useful in understanding the operation of the scan cell of FIG. 6.

FIG. 7 illustrates a timing diagram 700 useful in understanding the operation of scan cell 610 of FIG. 6. The horizontal axis represents time in nS, and the vertical axis represents the amplitude of various signals in volts. Timing diagram 700 illustrates six waveforms of interest, including a CLK waveform 705, an SC1 waveform 710, an SC2_CLK waveform 720, a CLK_g waveform 730, an ENABLE_g waveform 740, and an SC2_EN waveform 750. SC2_CLK waveform 720 includes pulses 722 and 724. Waveform 740 includes pulses of interest 741, 742, 743, 744, 745, and 746. CLK_g waveform 730 includes two pulses of interest and SC2_EN waveform 750 includes two pulses of interest.

In operation, before time t0, controller 250 operates scan cell 610 in a scan shift mode and provides non-overlapping SC1 (SC1 waveform 710) and SC2_CLK (SC2_CLK waveform 720) signals at a first, relatively low scan clock rate to shift a test pattern into the appropriate position in scan chain

260. Between times t0 and t7, controller 250 performs a series of warmup and restores sequences. Between time t7 and time t9, controller 250 performs a final launch and capture sequence. After time t7, controller 250 operates scan cells 610 in a scan shift mode to shift captured test data out of the scan chain. In particular, between time t0 and time t1, controller 250 performs an initial launch phase, followed by an initial capture phase in response to high pulse 741 on CLK_g between time t1 and t2. Between time t2 and t3, during which SC2_EN is high, controller 250 performs an initial restore phase and the data is restored to the output of output latch 616 on the next high pulse of SC2_CLK. Controller 250 repeats the sequence of warmup and restore phases enough times to warm up the functional circuits and to reduce the power supply voltage droop to a sufficiently small amount. After the desired number of times, controller 250 provides a final launch and capture phase (t7 to t9) to capture reliable test data into the scan chain, and a subsequent scan out phase using repetitive pulses of pulses SC1 and SC2_CLK.

Like scan cell 300, scan cell 610 captures reliable test data by warming up the functional circuits to reduce power supply voltage droop. Scan latch 614 provides hold time buffering for SDI and adds only a small amount of area compared to known LSSD scan cells.

Figure 8:
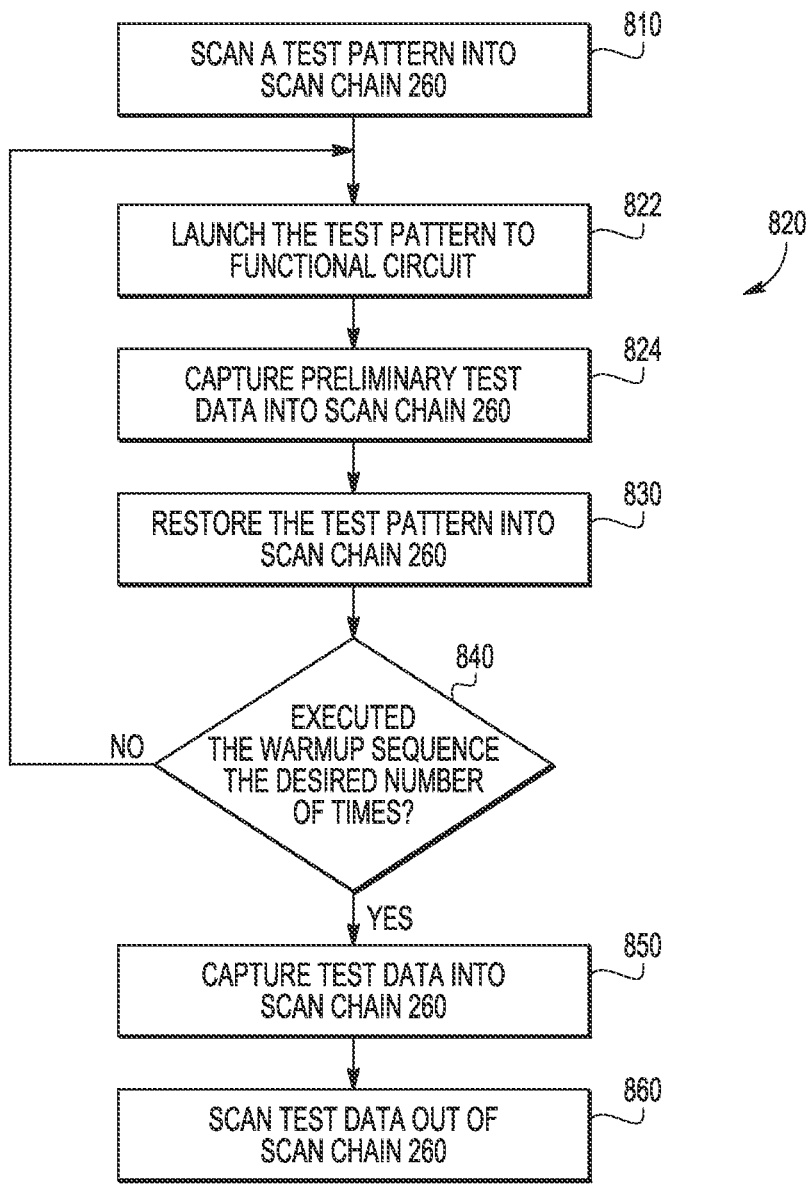
FIG. 8 illustrates a flow diagram of a method for scanning a test pattern into a scan chain according to some embodiments.

FIG. 8 illustrates a flow diagram of a method 800 for scanning a test pattern into scan chain 260 according to some embodiments. Action box 810 includes scanning a test pattern into scan chain 260. The flow proceeds to a set of action boxes 820 which warm up scan chain 260. Set 820 is implemented by an action box 822 that includes launching the test pattern to a functional circuit, and action box 824 that includes capturing preliminary test data into scan chain 260. The flow proceeds then to action box 830 that includes restoring the test pattern into scan chain 260.

The flow then proceeds to decision box 840 that includes determining whether the warmup sequence has been executed the desired number of times. If the warmup sequence has not been executed the desired number of times, then the flow proceeds back to action box 822. If the warmup sequence has been executed the desired number of times, then the flow proceeds to action box 845 that includes launching the test pattern into the functional circuit, action box 850 that includes capturing test data into scan chain 260, and action box 860 that includes scanning the test data to an output. When using a scan cell like scan cell 300 of FIG. 3, the method may further include an action box between action boxes 810 and 822, not shown in FIG. 8, that includes performing an initial restore phase to move the test pattern into a desired position in the scan chain.

The testing functions of scan cells 280 and 610 respectively of FIGS. 3 and 6, and test circuit 240 for functional circuits 210, 220, and 230 of FIG. 2 may be implemented with various combinations of hardware and software, and the software component may be stored in a computer readable storage medium for execution by at least one processor. Moreover the method illustrated in FIG. 8 may also be governed by instructions that are stored in a computer readable storage medium and that are executed by at least one processor. Each of the operations shown in FIG. 8 may correspond to instructions stored in a non-transitory computer memory or computer readable storage medium. In various embodiments, the non-transitory computer readable storage medium includes a magnetic or optical disk storage device, solid state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

Moreover, scan cells 280 and 610 of FIGS. 3 and 6 respectively, and test circuit 240 for functional circuits 210, 220, and 230 of FIG. 2 may be described or represented by a computer accessible data structure in the form of a database or other data structure which can be read by a program and used, directly or indirectly, to fabricate integrated circuit 200. For example, this data structure may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising integrated circuit 200. The netlist may then be placed and routed to produce a data set describing geometric shapes to be applied to masks. The masks may then be used in various semiconductor fabrication steps to produce integrated circuit 200. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. For example, functional circuits 210, 220, and 230 can represent a variety of elements including a GPU, a CPU core, an APU, a memory sub-system, a system controller (a "north bridge" or a "south bridge"), complex peripheral functions, and so on, and sub-circuits of each of them. Also, in some embodiments, functional circuits 210, 220, and 230 could include a certain number of functional blocks, where a functional block could include a certain set of GPUs, CPU cores, APUs, memory sub-systems, system controllers, complex peripheral functions, and so on. For example, in some embodiments, representative functional circuit 210 includes a CPU core, an APU, and a Universal Serial Bus ("USB") controller, and representative functional circuit 220 could include a memory sub-system and a bus arbitration module. Also, the circuits of integrated circuit 200 could be formed on multiple integrated circuits.

The illustrated embodiments show restore latch 310 and scan latch 614 being implemented within scan cells 280 and 610, respectively. In some embodiments, restore latch 310 and scan latch 614 could be implemented anywhere along scan chain 260, and could be considered to be between scan cells 280.

While test circuit 240 improves the integrity of the test by implementing scan warmup to reduce the power supply droop, it can be used in conjunction with other techniques to reduce the droop. For example, test circuit 240 can be used on an integrated circuit that also uses on-die droop inducers (ODDI). ODDI are essentially transistors between the power supply terminals that are made conductive to simulate the current flowing through the power supply rails when the circuit is operating at speed.

Accordingly, it is intended by the appended claims to cover all modifications of the disclosed embodiments that fall within the scope of the disclosed embodiments.

What is claimed is:
1. A test circuit for a functional circuit comprising:
   a scan chain coupled to the functional circuit; and
   a controller coupled to said scan chain, for controlling said scan chain to scan a test pattern into said scan chain, and subsequently and repetitively for a plurality of times launch said test pattern to the functional circuit, capture test data into said scan chain, and restore said test pattern in said scan chain for subsequent launch without scanning said test pattern into said scan chain.

2. The test circuit of claim 1, wherein said scan chain comprises a plurality of scan cells, each of said plurality of scan cells comprising:
a restore latch having an input for receiving a scan data input signal, a control input for receiving a warmup enable signal, and an output;
a multiplexer having a first input coupled to said output of said restore latch, a second input for receiving a data signal, a control input for receiving a scan shift enable signal, and an output; and
a scan latch having a data input coupled to said output of said multiplexer, a control input for receiving a clock signal, and an output coupled to the functional circuit.

3. The test circuit of claim 2, wherein said restore latch is characterized as being level sensitive.

4. The test circuit of claim 2, wherein said scan latch is characterized as being edge sensitive.

5. The test circuit of claim 1, wherein said scan chain comprises a plurality of scan cells, each of said plurality of scan cells comprises:
a data latch having an input for receiving a data input signal, a control input for receiving a gated clock signal, and an output;
a scan latch having an input for receiving a scan data input signal, a control input for receiving a first scan clock signal, and an output; and
an output latch having a first data input coupled to said output of said data latch, a second data input coupled to said output of said scan latch, a first control input for receiving said gated clock signal, a second control input for receiving a second scan clock signal, and an output coupled to the functional circuit.

6. The test circuit of claim 5, wherein said data latch, said scan latch, and said output latch are each characterized as being level sensitive.

7. The test circuit of claim 1, wherein:
said controller, after said plurality of times, controls said scan chain to scan said test data to an output thereof.

8. The test circuit of claim 1, wherein:
said plurality of times corresponds to a time interval during which a power supply voltage initially deviates from a nominal value and subsequently returns to approximately the nominal value.

9. A test circuit for a functional circuit comprising:
a scan chain coupled to the functional circuit and comprising a plurality of scan cells coupled in a chain, each including a restore latch and a scan latch; and
a controller coupled to said scan chain, for controlling said scan chain to scan a test pattern into said restore latches, and subsequently and repetitively for a plurality of times launch said test pattern from said scan latches to the functional circuit, capture test data from the functional circuit into said scan latches, and restore said test pattern from said scan latches to an input of said scan latches.

10. The test circuit of claim 9, wherein said restore latch is characterized as being level sensitive.

11. The test circuit of claim 9, wherein said scan latch is characterized as being edge sensitive.

12. The test circuit of claim 9, wherein for each of said plurality of scan cells:
said restore latch has an input for receiving a scan data input signal, a control input for receiving a warmup enable signal, and an output;
said scan latch has a data input, a control input for receiving a clock signal, and an output coupled to the functional circuit; and
each of said plurality of scan cells further comprises a multiplexer having a first input coupled to said output of said restore latch, a second input for receiving a data signal, a control input for receiving a scan shift enable signal, and an output coupled to said data input of said scan latch.

13. The test circuit of claim 9, wherein:
said controller after said plurality of times, controls said scan chain to scan said test data to an output thereof.

14. The test circuit of claim 9, wherein:
said plurality of times corresponds a time interval during which a power supply voltage initially deviates from a nominal value and subsequently returns to approximately the nominal value.

15. A method comprising:
scanning a test pattern into a scan chain;
subsequently and repetitively for a plurality of times and without scanning said test pattern into said scan chain:
warming up a functional circuit; and
restoring said test pattern to into said scan chain;
capturing test data from said functional circuit into said scan chain; and
scanning said test data out of said scan chain.

16. The method of claim 15 wherein said scanning said test pattern into said scan chain comprises:
performing an initial restore phase to move said test pattern into a desired position in said scan chain.

17. The method of claim 15 wherein said scanning said test pattern into said scan chain comprises:
scanning said test pattern into a plurality of scan cells of said scan chain.

18. The method of claim 17 wherein said scanning said test pattern into said scan chain further comprises:
scanning said test pattern into a plurality of scan latches through a corresponding plurality of restore latches.

19. The method of claim 18 wherein said scanning said test pattern into said plurality of scan latches through said corresponding plurality of restore latches further comprises:
scanning said test pattern into said plurality of scan latches through a corresponding plurality of level-sensitive restore latches.

20. The method of claim 15 wherein said restoring comprises:
activating a clock signal to a clock input of an edge sensitive scan latch for each of a plurality of scan cells of said scan chain.

21. The method of claim 15 wherein:
said scanning said test pattern into said scan chain comprises scanning said test pattern into a plurality of scan cells of said scan chain at a first rate; and
said warming up said scan chain comprises warming up said scan chain at a second rate higher than said first rate.

22. The method of claim 21 wherein:
said scanning said test data out of said scan chain comprises scanning said test data out of said scan chain at said first rate.

23. The method of claim 15 wherein said warming up said functional circuit comprises:
launching said test pattern to said functional circuit; and
capturing preliminary test data into said scan chain.

* * * * *